(12) United States Patent
Mulligan

(10) Patent No.: US 7,179,720 B2
(45) Date of Patent: Feb. 20, 2007

(54) PRE-FABRICATION SCRIBING

(75) Inventor: Rose Mulligan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/729,176

(22) Filed: Dec. 4, 2003

(65) Prior Publication Data
US 2005/0124140 A1    Jun. 9, 2005

(51) Int. Cl.
*H01L 21/301*    (2006.01)
(52) U.S. Cl. ..................... 438/460; 438/113
(58) Field of Classification Search .......... 438/113, 438/114, 460
See application file for complete search history.

(56) References Cited

U.S. PATENT DOCUMENTS

| | | | | |
|---|---|---|---|---|
| 5,414,297 A | * | 5/1995 | Morita et al. | 257/620 |
| 5,716,495 A | * | 2/1998 | Butterbaugh et al. | 438/708 |
| 2004/0232524 A1 | * | 11/2004 | Howard et al. | 257/620 |

* cited by examiner

*Primary Examiner*—Jack Chen
(74) *Attorney, Agent, or Firm*—Erik M. Metzger

(57) ABSTRACT

Singulating a wafer into individual die using a pre-scribing technique. Embodiments of the invention relate to scribing a wafer prior to the fabrication process in order to help preserve the integrity of the fabricated devices during singulation.

7 Claims, 1 Drawing Sheet

PRE-FABRICATION SCRIBING

FIELD

Embodiments of the invention relate to semiconductor manufacturing. More particularly, embodiments of the invention relate to scribing a wafer prior to the fabrication process in order to help preserve the integrity of the fabricated devices during singulation.

BACKGROUND

Singulation is a process of separating a semiconductor die from other semiconductor dies on a wafer either completely by cutting through the wafer or by creating a trench in the wafer such that the dies can be separated relatively easily. Typically, singulation is performed after devices, such as complementary metal-oxide-semiconductor ("CMOS") devices, are formed on the wafer.

The process of cutting into or completely through the semiconductor wafer between each die, however, can cause cracking in the surrounding semiconductor substrate. The cracking can also propagate into the devices formed on the wafer surface, causing the loss wafer die.

FIG. 1 illustrates a cross-section of a wafer that has had a prior art singulation process performed on it. In FIG. 1, trenches 101 have been scribed into the wafer to separate the dies 125 after the devices 115 have been formed on the dies. The dies have then been separated by a saw cut 110. In the prior art example of FIG. 1, however, either the trenches or the saw cut can cause cracking in the wafer substrate, which can effect electrical characteristics of the devices formed on the wafer prior to the trenches or saw cut or propagate to the devices themselves.

BRIEF DESCRIPTION OF THE DRAWINGS

Embodiments of the invention are illustrated by way of example and not limitation in the figures of the accompanying drawings, in which like references indicate similar elements and in which:

FIG. 3b is a cross section of a wafer according to one embodiment of the invention after devices have been formed on the wafer of FIG. 3a.

FIG. 3d is a closer perspective of the cross section of the wafer of FIG. 3c, according to one embodiment of the invention, in which the wafer has been back-grinded to the bottom of the trenches formed by the dicing operation illustrated in FIG. 3a.

DETAILED DESCRIPTION

Embodiments of the invention help to reduce the risk of damage to semiconductor wafer dies caused by cracking during singulation. More particularly, embodiments of the invention reduce the risk of damage to the dies by performing at least part of the singulation process before devices, such as complementary metal-oxide-semiconductor (CMOS) devices, are formed on the wafer surface.

Generally, embodiments of the invention help reduce the number of lost die on a wafer due to damage from singulation by forming the singulation trenches in the silicon wafer before any devices are deposited thereon. For at least one embodiment of the invention, a saw is used to create a singulation trench of approximately equal depth as the intended final die thickness. In other embodiments of the invention, an etch or laser may be used to create the singulation trenches. After devices are deposited on the wafer, the singulation trench may then be scribed with an etch or laser to remove any devices that were deposited, or any damaged silicon that resulted from the saw cut, near the singulation trench. Finally, the wafer may be back grinded to the bottom of the singulation trench or just below it in order to separate the die.

Figure 1:
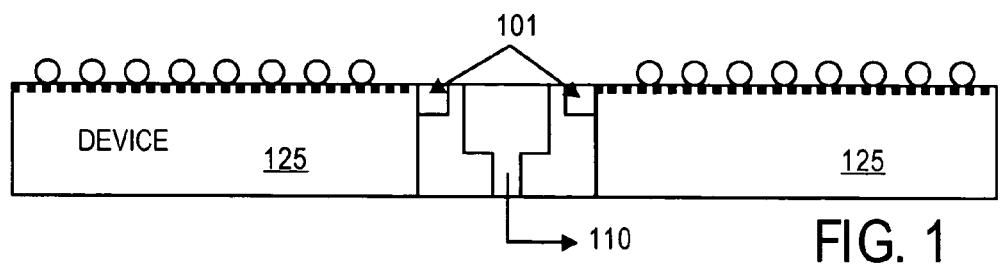
FIG. 1 illustrates a prior art scribe and singulation process.
Figure 2:
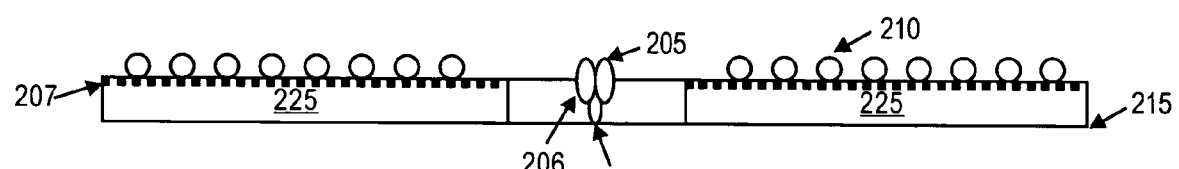
FIG. 2 illustrates a cross section of a wafer that has undergone a singulation process according to one embodiment of the invention.

FIG. 2 illustrates a cross section of a wafer that has undergone singulation according to one embodiment of the invention. A scribed singulation trench 201 has been formed in the wafer between each die 225 that extends approximately 90 to 150 microns from the wafer surface into the substrate. In other embodiments of the invention, the trench may extend further or not as far into the trench, depending upon the thickness or material of the wafer. Trenching is performed before the CMOS devices are formed on the die, for one embodiment of the invention, in order to reduce the risk of damage to the CMOS device while the trench is being formed.

The singulation trench has also been filled with an oxide 205 in order to protect it from later processing steps and materials. For other embodiments of the invention, the oxide may only be deposited within the scribed portion 206 of the singulation trench, which is indicated by the wider portion of the trench near the surface of the wafer in FIG. 2. The oxide may then be planarized or removed altogether by etch or laser.

After the CMOS devices 207 and ball grid interconnects 210 had been formed on the wafer surface, the wafer was back-grinded to the bottom of the trenches 215 in order to complete the singulation process. In other embodiments, the wafer may be back-grinded to a point just below the bottom of the trenches so that a subsequent process step can separate the dies via mechanical means. For other embodiments of the invention, the back-grinding may be performed after the devices are formed on the wafer but before the ball grid interconnects are formed.

Figure 3A:
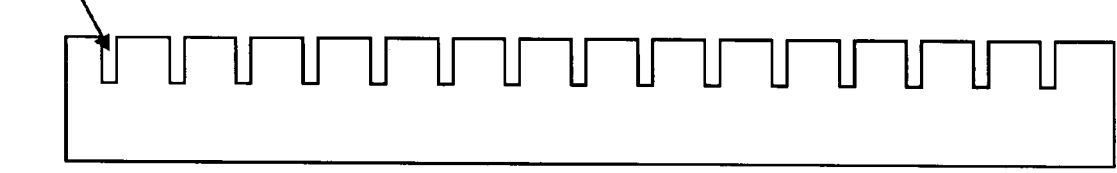
FIG. 3a is a cross section of a wafer that has undergone a dicing operation according to one embodiment of the invention to form singulation trenches.
Figure 3B:
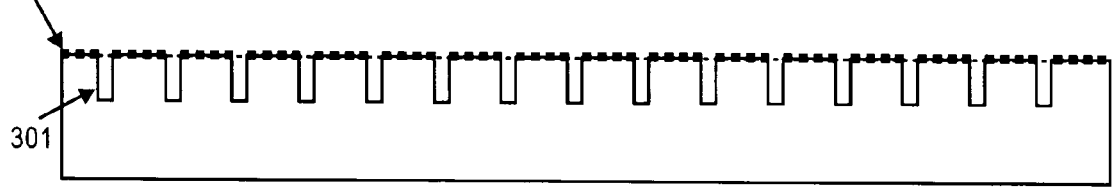

FIGS. 3a–3d illustrate a wafer that has undergone operations included in a singulation process according to one embodiment of the invention. As shown in FIG. 3a, the wafer has been diced by forming singulation trenches 301 that extend to approximately 90 to 150 microns from the surface of the wafer for one embodiment of the invention. As shown in FIG. 3b, CMOS devices 307 may then be formed on the wafer, some of which may extend into the singulation trenches 301.

Figure 3C:
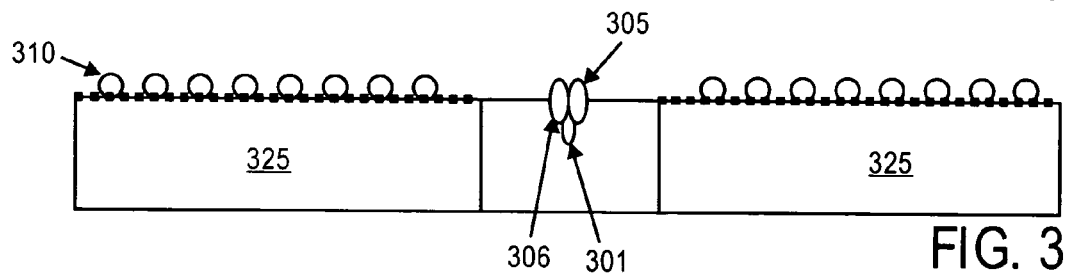
FIG. 3c is a closer perspective of the cross section of the wafer of FIG. 3b, according to one embodiment of the invention, after ball grid interconnects have been formed on top of the devices deposited in FIG. 3b and after the singulation trenches formed in FIG. 3a have been scribed.

FIG. 3c is a closer perspective of the wafer cross-section, in which the singulation trench 301 has been scribed using a laser or etch process to remove any devices that were deposited, or any damaged silicon, near the singulation trench area. FIG. 3c also illustrates ball grid interconnects 310 that are formed on top of the devices on either side of the singulation trenches. Finally, FIG. 3c illustrates oxide 305 that is formed within the singulation trench. For other embodiments of the invention, the oxide may only be deposited within the scribed portion 306 of the singulation trench.

Figure 3D:
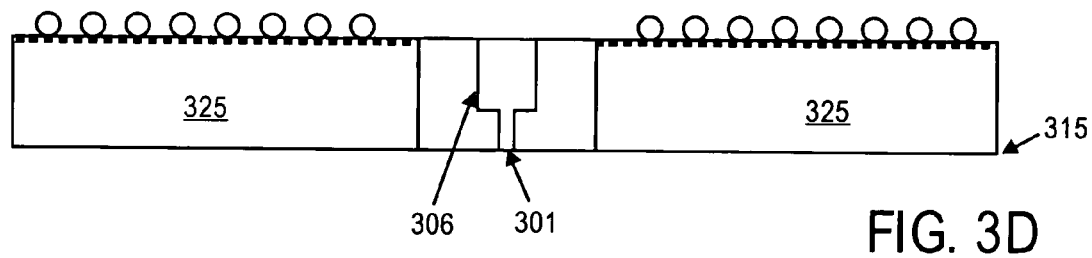

FIG. 3*d* illustrates an even closer view of the singulation trench 301 separating the two die 325. As shown in FIG. 3*d*, the wafer has been back grinded to the bottom 315 of the singulation trenches in order to separate the two die 325. Furthermore, in FIG. 3*d*, a laser or etch has been used to ablate the oxide layer deposited earlier in the process, leaving the singulation trench 301 and its scribed portion 306 exposed. For other embodiments of the invention, the wafer can be back grinded to just below the singulation trenches and the die can be separated by mechanical means.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A process comprising:
    dicing a semiconductor wafer before forming devices on the semiconduct wafer, the dicing forming wenches in the semiconductor wafer;
    back-grinding the semiconductor wafer after forming the devices on the semiconductor wafer;
    scribing the trenches.

2. The process of claim 1 further comprising forming an oxide in the trenches formed by dicing the semiconductor wafer.

3. The process of claim 2 further comprising removing the oxide after the devices are formed on the semiconductor wafer.

4. The process of claim 3 wherein the scribing is performed by using a laser.

5. The process of claim 1 wherein the dicing is performed by one of a group of processes consisting of sawing, etching, and lasering.

6. The process of claim 5 wherein the trenches extend 90 to 150 microns from the surface of the semiconductor wafer.

7. A method comprising:
    singulating a plurality of die on a semiconductor wafer by creating a plurality of trenches extending approximately 90 to 150 microns from the surface of the semiconductor wafer before forming devices on the plurality of die;
    back-grinding the semiconductor wafer to the bottom of the plurality of trenches;
    scribing the plurality of trenches;
    forming oxide in the plurality of trenches;
    planarizing the oxide;
    removing the oxide.

* * * * *

UNITED STATES PATENT AND TRADEMARK OFFICE
CERTIFICATE OF CORRECTION

PATENT NO. : 7,179,720 B2 Page 1 of 1
APPLICATION NO. : 10/729176
DATED : February 20, 2007
INVENTOR(S) : Rose Mulligan It is certified that error appears in the above-identified patent and that said Letters Patent is hereby corrected as shown below:

Column 3:
Line 24, "semiconduct" should be --semiconductor--;
Line 24, "wenches" should be --trenches--.

Signed and Sealed this

Fourteenth Day of August, 2007

JON W. DUDAS
*Director of the United States Patent and Trademark Office*